(12) United States Patent
Wang et al.

(10) Patent No.: US 8,377,320 B2
(45) Date of Patent: Feb. 19, 2013

(54) METHOD OF FORMING AN UNDERCUT MICROSTRUCTURE

(75) Inventors: Tzyy-Jiann Wang, Taipei (TW); Yueh-Hsun Tsou, Taipei (TW)

(73) Assignee: National Taipei University of Technology, Taipei (TW)

( * ) Notice: Subject to any disclaimer, the term of this patent is extended or adjusted under 35 U.S.C. 154(b) by 333 days.

(21) Appl. No.: 12/842,334

(22) Filed: Jul. 23, 2010

(65) Prior Publication Data
US 2011/0250397 A1    Oct. 13, 2011

(30) Foreign Application Priority Data

Apr. 13, 2010   (TW) .............................. 99111450 A

(51) Int. Cl.
| | |
|---|---|
| *C03C 10/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *H01L 21/00* | (2006.01) |

(52) U.S. Cl. ............ 216/48; 438/31; 438/377; 438/705; 438/739

(58) Field of Classification Search .................... 216/48; 438/31, 369–377, 418–419, 705, 739
See application file for complete search history.

(56) References Cited

U.S. PATENT DOCUMENTS

| | | | | |
|---|---|---|---|---|
| 4,155,783 A | * | 5/1979 | Feist ............................ | 148/33.2 |
| 5,086,013 A | * | 2/1992 | Shimizu et al. ............... | 438/670 |
| 5,662,768 A | * | 9/1997 | Rostoker ....................... | 257/301 |
| 6,784,076 B2 | * | 8/2004 | Gonzalez et al. ............. | 438/426 |
| 6,842,688 B2 | * | 1/2005 | Kasbauer et al. ............. | 701/108 |
| 2002/0096496 A1 | * | 7/2002 | Molnar et al. ................ | 216/87 |
| 2007/0281488 A1 | * | 12/2007 | Wells et al. ................... | 438/705 |
| 2011/0186938 A1 | * | 8/2011 | Li et al. ........................ | 257/408 |

OTHER PUBLICATIONS

Wang, T. J. et al. "Electro-optically tunable microring resonators in lithium niobate" Oct. 1, 2007, Opt. Lett., 32(19), 2777-2779.*
Crunteanu, A. et al. "Three-dimensional structuring of sapphire by sequential He+ ion-beam implantation and wet chemical etching" Feb. 26, 2003, Appl. Phys. A, 76, 1109-1112.*
Hartung, H. et al. "Fabrication of ridge waveguides in zinc-substituted lithium niobate by means of ion-beam enhanced etching" Oct. 15, 2008, Opt. Lett., 33(20), 2320-2322.*
Levy, M. et al. "Fabrication of single-crystal lithium niobate films by crystal ion slicing" Oct. 19, 1998, Appl. Phys. Lett., 73(16), 2293-2295.*
Chen, F. "Photonic guiding structures in lithium niobate crystals produced by energetic ion beams" Oct. 21, 2009, J. Appl. Phys. 106, 081101.*

* cited by examiner

*Primary Examiner* — Parviz Hassanzadeh
*Assistant Examiner* — Margaret D Klunk
(74) *Attorney, Agent, or Firm* — Occhiuti Rohlicek & Tsao LLP

(57) ABSTRACT

A method of forming an undercut microstructure includes: forming an etch mask on a top surface of a substrate; forming, on a top surface of the etch mask, an ion implantation mask having a top surface that is smaller than the top surface of the etch mask and that does not extend beyond the top surface of the etch mask; ion implanting the substrate in the presence of the etch mask and the ion implantation mask so that a damaged region is generated at a depth below an area of the surface that is not masked by the ion implantation mask; and etching the surface of the substrate until the damaged region is removed.

6 Claims, 7 Drawing Sheets

METHOD OF FORMING AN UNDERCUT MICROSTRUCTURE

CROSS-REFERENCE TO RELATED APPLICATION

This application claims priority of Taiwanese application no. 099111450, filed on Apr. 13, 2010.

BACKGROUND OF THE INVENTION

1. Field of the Invention

This invention relates to a method of forming an undercut microstructure, more particularly to a method involving ion implanting a substrate and etching the ion implanted substrate to form an undercut microstructure.

2. Description of the Related Art

Ridge-like microstructures formed from a substrate made from a nonlinear optical crystal, such as $LiNbO_3$ or $LiTaO_3$, or a semiconductor, such as Si or Ge, are widely used as optical waveguide devices of an optical integrated circuit, such as tunable microring resonators and wavelength division multiplexers (WDM) of an optical integrated circuit.

FIGS. 1 and 2 illustrate a conventional tunable microring resonator 1 formed on a nonlinear optical crystal substrate 10 of $Ti:LiNbO_3$ (see *OPTICS LETTERS*, Vol. 32, No. 19 (2007) 2777 (3 pp) disclosed by the inventor of the present patent application). The conventional tunable microring resonator 1 includes a loop-shaped microring waveguide 11 protruding from the substrate 10 (see FIG. 2), and first and second couplers 12, 13 (i.e., straight waveguides) coupled respectively to two opposite sides of the microring waveguide 11. The function of the waveguide is to confine an optical field 15 of a light beam passing therethrough as much as possible. However, when the radius of the microring waveguide 11 is reduced to less than 100 μm, the geometric structure of the microring waveguide 11 causes a loss of the optical field 15 that radiates into the substrate 10. The loss of the optical field 15 limits further reduction of the radius of the microring waveguide 11 for purposes of miniaturizing the conventional tunable microring resonator 1 and achieving a highly dense optical integrated circuit.

In order to reduce the loss of the optical field 15, it has been proposed to undercut the microring waveguide 11 so as to increase a refractive index contrast at a bottom side of the microring waveguide 11 adjacent to the substrate 10, thereby increasing the optical field-confining ability of the microring waveguide 11. Conventional methods of forming an undercut under a microstructure normally involve forming a sacrificial layer between a substrate and a waveguide-forming layer with an etch rate much less than that of the sacrificial layer, followed by wet etching or reactive ion etching the sacrificial layer and the waveguide-forming layer. Since two layers of different materials having different etch rates are required, the conventional methods are complicated and time-consuming.

In addition, undercut microstructures formed on the semiconductor (Si or Ge) may also be used as parts of electronic devices, such as transistors, to achieve high frequency operation by reducing junction capacitance, or parts of electro-optic devices, such as photodiodes, to achieve improvement of carrier confinement and enhancement of quantum efficiency. U.S. Pat. No. 6,842,688 discloses a conventional method of forming a MOSFET with a T-shaped gate, which includes: forming a polysilicon layer on a gate oxide; forming an amorphous Si layer, that has an etch rate less than that of the polysilicon layer, on the polysilicon layer; forming an etched photoresist on the amorphous Si layer; and after formation of the etched photoresist, subjecting an assembly of the polysilicon layer, the amorphous Si layer, and the gate oxide to multi-step dry plasma etching so as to form the T-shaped gate on the gate oxide. The aforesaid conventional method of forming the MOSFET with the T-shaped gate is also complicated and time-consuming due to the requirement for depositing two layers of different materials having different etch rates on the substrate.

SUMMARY OF THE INVENTION

Therefore, the object of the present invention is to provide a method of forming an undercut microstructure that is relatively simple as compared to the prior art.

Another object of the present invention is to provide an undercut microstructure made by the method of this invention.

According to one aspect of this invention, there is provided a method of forming an undercut microstructure having a trunk portion and an enlarged top end portion that is connected to the trunk portion. The method comprises: forming an etch mask on a top surface of a substrate; forming, on a top surface of the etch mask, an ion implantation mask having a top surface that is smaller than the top surface of the etch mask and that does not extend beyond the top surface of the etch mask; ion implanting the substrate in the presence of the etch mask and the ion implantation mask so that a damaged region is generated at a depth below an area of the surface that is not masked by the ion implantation mask; and etching the surface of the substrate until the damaged region is removed.

According to another aspect of this invention, there is provided an undercut microstructure useful as an optical waveguide device, an electro-optic device, or an electronic device and made by the method of the present invention.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
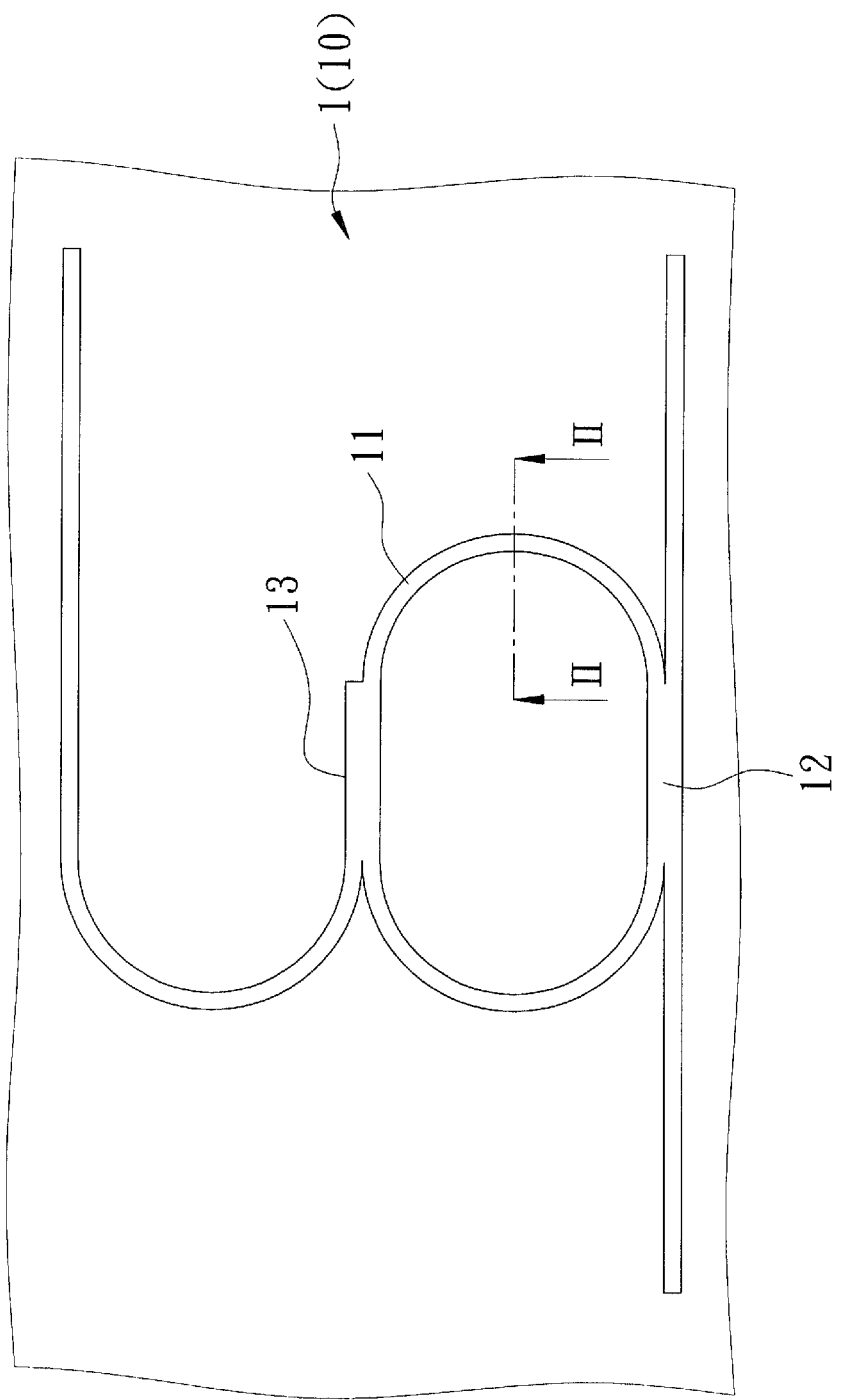
FIG. 1 is a top view to illustrate the structure of a conventional tunable microring resonator formed on a nonlinear optical crystal substrate of $Ti:LiNbO_3$.
Figure 2:
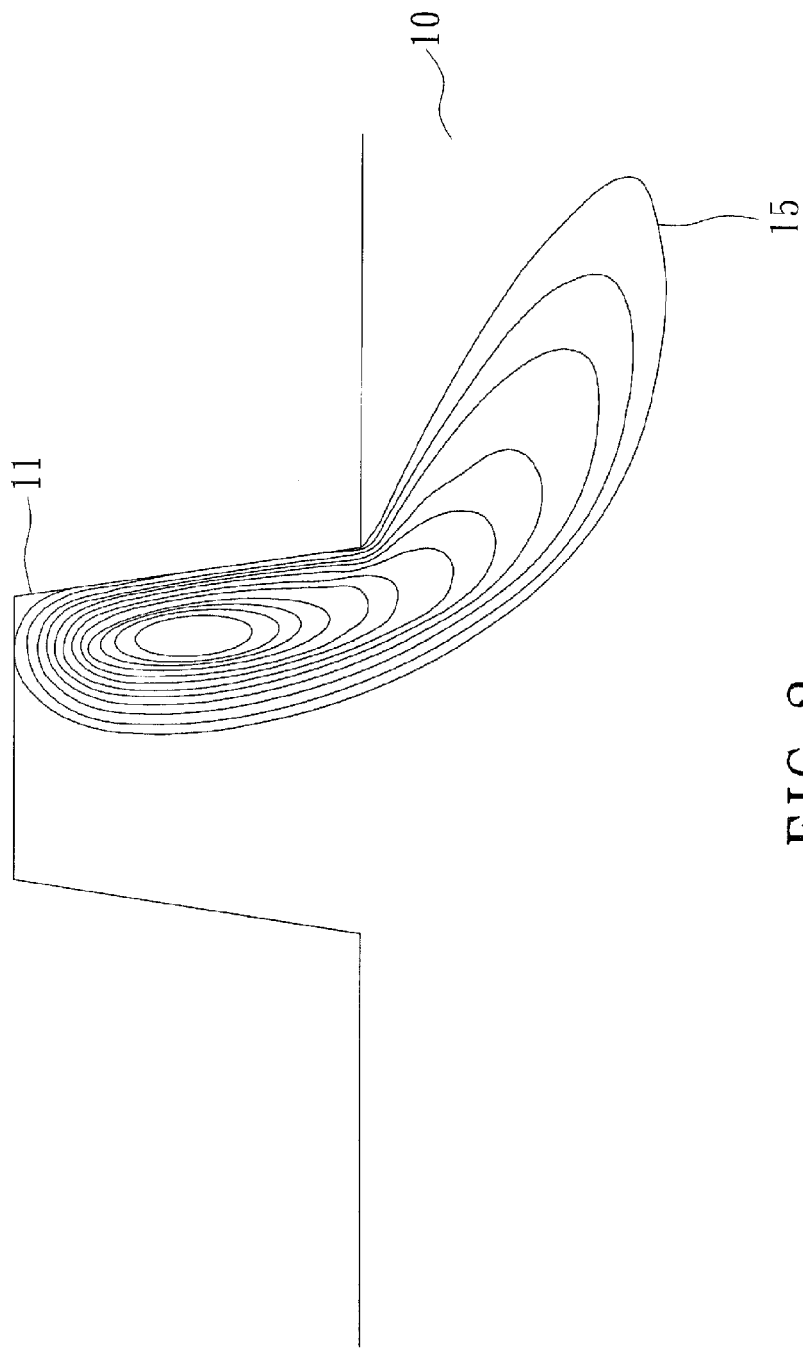
FIG. 2 is a sectional view taken along line II-II of FIG. 1 to illustrate an optical field confined in a microring waveguide of the conventional tunable microring resonator.
Figure 3A:
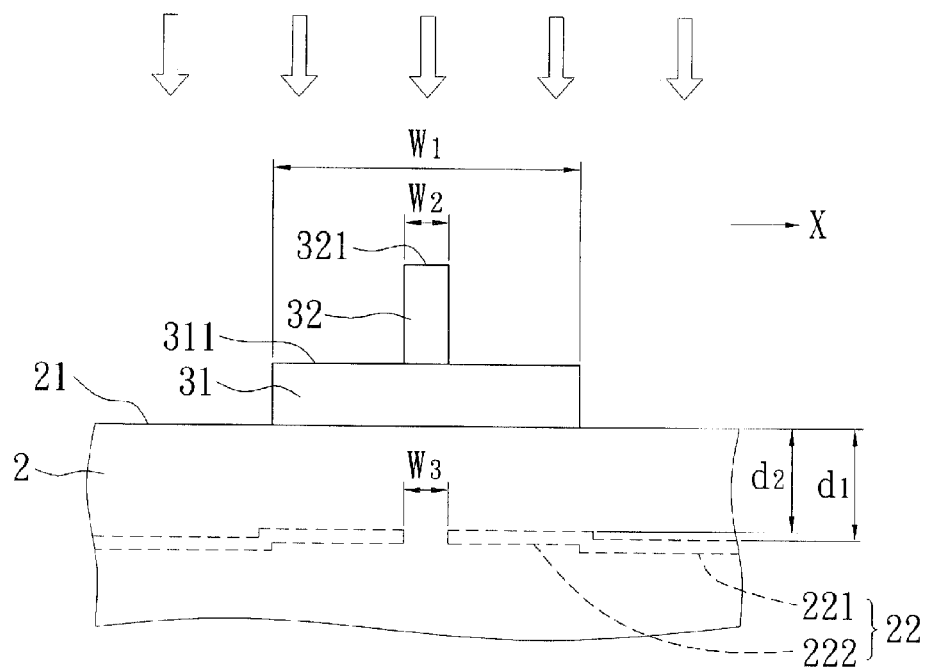
FIGS. 3a to 3e are schematic diagrams to illustrate consecutive steps of the preferred embodiment of a method of forming an undercut microstructure according to this invention.
Figure 3B:
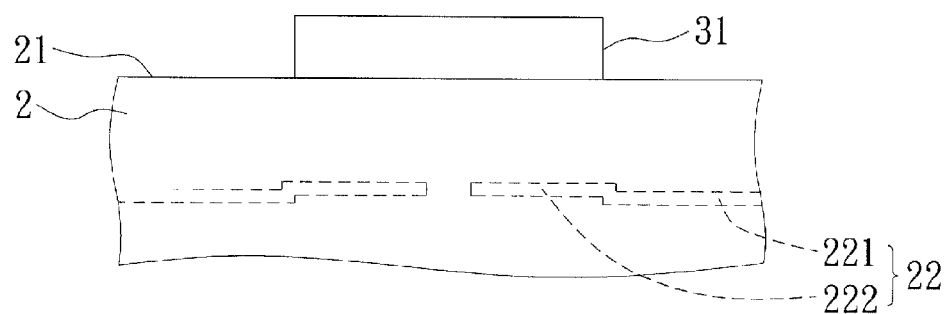
Figure 3C:
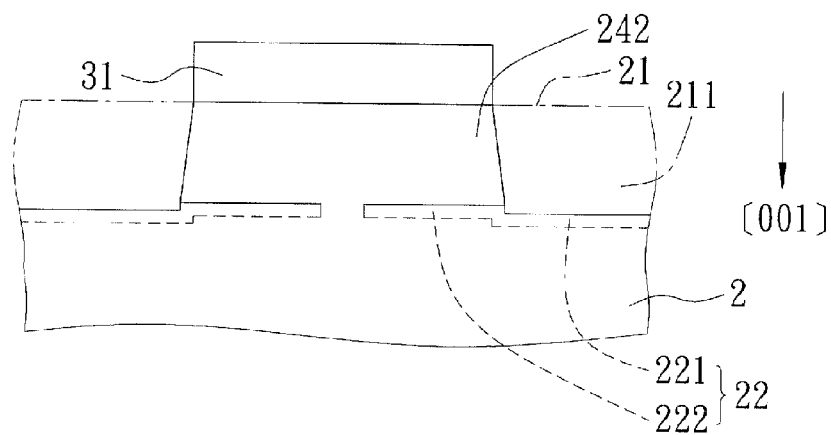
Figure 3D:
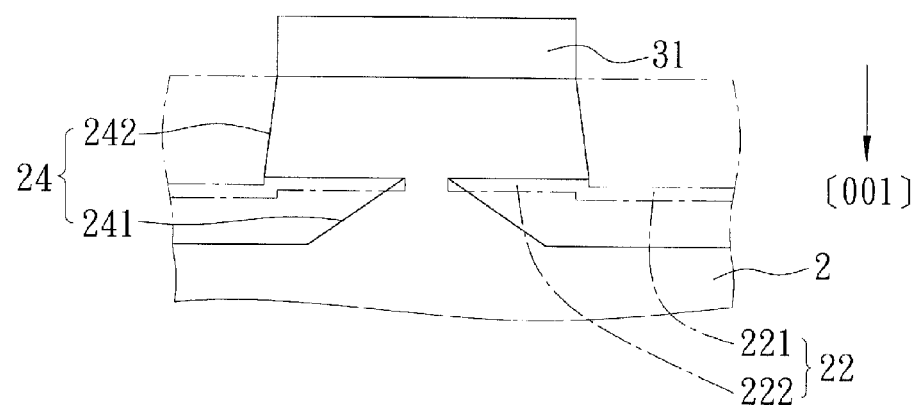
Figure 3E:
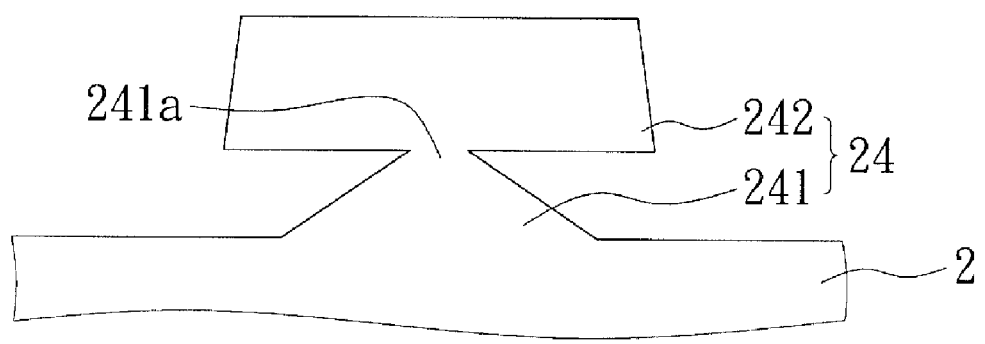

Referring to FIGS. 3a to 3e, the preferred embodiment of a method of forming an undercut microstructure 24 having a trunk portion 241 with an upper end 241a and an enlarged top end portion 242 enlarged in cross-section from the upper end 241a of the trunk portion 241 according to the present invention is shown to include the steps of: forming an etch mask 31 on a top surface 21 of a substrate 2 (see FIG. 3a); forming, on a top surface 311 of the etch mask 31, an ion implantation mask 32 having a top surface 321 that is smaller than the top surface 311 of the etch mask 31 and that does not extend beyond the top surface 311 of the etch mask 31 (see FIG. 3a); ion implanting the substrate 2 in the presence of the etch mask 31 and the ion implantation mask 32 so that a damaged region 22 is generated at a depth below an area of the surface 21 of the substrate 2 that is not masked by the ion implantation mask 32 (see FIG. 3a); and etching the surface 21 of the substrate 2 until the damaged region 22 is removed (see FIGS. 3c and 3d).

The damaged region 22 includes a first damaged portion 221 and a second damaged portion 222 extending from the first damaged portion 221. The first damaged portion 221 is generated at a depth below the area of the surface 21 that is not masked by the etch mask 31, and the second damaged portion 222 is generated at a depth below the area of the surface 21 that is masked by the etch mask 31 but is not masked by the ion implantation mask 32. The depth ($d_1$) of the first damaged portion 221 from the surface 21 of the substrate 2 is larger than the depth ($d_2$) of the second damaged portion 22 from the surface 21 of the substrate 2 (see FIG. 3a).

Preferably, the substrate 2 is made from a nonlinear optical single crystal, such as $LiNbO_3$ or $LiTaO_3$, or a semiconductor single crystal, such as Si or Ge. In an example of this invention, the substrate 2 was made from a z-cut $LiNbO_3$ single crystal having a trigonal crystal structure.

Preferably, the top surface 311 of the etch mask 31 has a first width ($W_1$) along a direction (X), and the etch mask 31 is made from photoresists, dielectrics, or metals. Preferably, the top surface 321 of the ion implantation mask 32 has a second width ($W_2$) along the direction (X) less than the first width ($W_1$), and the ion implantation mask 32 is made from photoresists, dielectrics, or metals. The width ($W_3$) of the upper end 241a of the trunk portion 241 of the undercut microstructure 24 along the direction (X) can be controlled by controlling the second width ($W_2$) of the top surface 321 of the ion implantation mask 32. The smaller the width ($W_3$) of the upper end 241a of the trunk portion 241, the higher will be the optical field-confining ability of the enlarged top end portion 242.

Preferably, formation of each of the etch mask 31 and the ion implantation mask 32 is performed by coating, followed by lithography, or vice versa. More preferably, the lithography is conducted through one of photolithography techniques and electron-beam lithography techniques.

Preferably, the etching of the substrate 2 is conducted by wet etching techniques, reactive ion etching (RIE) techniques, plasma etching techniques, or inductively coupled plasma (ICP) etching techniques. More preferably, the etching of the substrate 2 in this case is conducted by wet etching techniques.

Preferably, the ion implantation mask 32 is disposed within the etch mask 31, i.e., is not overlaid on an edge of the etch mask 31.

Preferably, the preferred embodiment of the present invention further includes removing the ion implantation mask 32 after ion implantation and prior to the etching of the substrate 2 (see FIGS. 3a to 3c). Preferably, the preferred embodiment further includes removing the etch mask 31 after the etching of the substrate 2 so as to form the undercut microstructure 24 (see FIGS. 3d and 3e).

The undercut microstructure 24 formed by the method of this invention is useful as an optical waveguide device, an electro-optic device, or an electronic device.

In the example of this invention, the ion implantation mask 32 is disposed on the etch mask 31 during ion implantation (see FIG. 3a), the etch mask 31 is made from Cr, and has a layer thickness of 120 nm and a first width ($W_1$) of 8 μm, and the ion implantation mask 32 is made from photoresists, and has a layer thickness of 2 μm and a second width ($W_2$) of 3 μm. The etch mask 31 was formed by radio-frequency (r.f.) magnetron sputtering techniques. The ion implantation mask 32 was formed by spin coating, followed by photolithography techniques. The ion implantation was performed by using He ions under an implantation energy of 1.3 MeV.

In the example, the substrate (the z-cut $LiNbO_3$ single crystal) 2 was subjected to wet etching by using dilute hydrofluoric acid (HF) solution. The dilute HF solution only etches the substrate 2 along the [001] direction of the $LiNbO_3$ single crystal as shown in FIGS. 3c and 3d. The etch rate of the damaged region 22 of the substrate 2 is greater than that of the remaining region of the substrate 2, which is not damaged by the ion implantation (i.e., non-damaged region). As a consequence, the dilute HF solution removes initially the portion 211 of the substrate 2 that is not covered by the etch mask 31 along the [001] direction of the $LiNbO_3$ single crystal so as to expose the first damaged portion 221 of the damaged region 22 (see FIG. 3c), and then not only removes the damaged region 22 of the substrate 2 from the first damaged portion 221 of the damaged region 22 to the second damaged portion 222 of the damaged region 22 but also removes a portion of the substrate 2 underneath the damaged region 22 along the [001] direction of the $LiNbO_3$ single crystal (see FIG. 3d).

The undercut microstructure 24 thus formed in this example is useful as an optical waveguide device.

Figure 4:
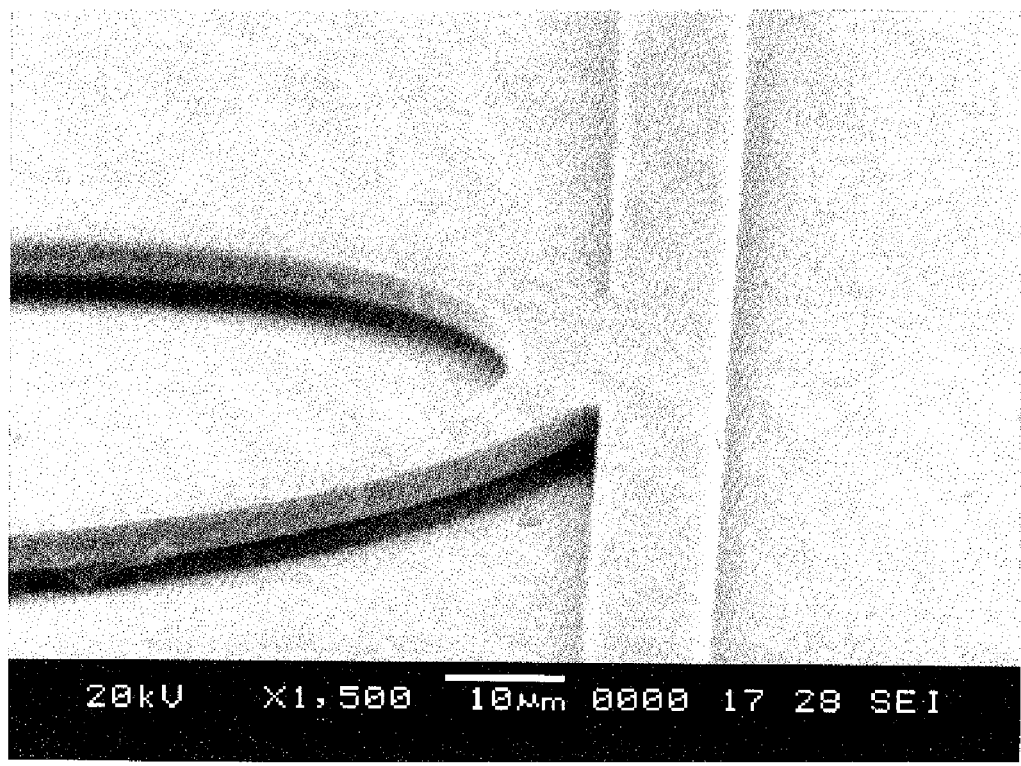
FIG. 4 is a scanning electron microscope (SEM) image to show the structures of two undercut microstructures, which serve respectively as a straight waveguide device and a microring waveguide device of a microring resonator on a $LiNbO_3$ substrate, made by the method of this invention.

FIG. 4 shows the SEM image of two undercut microstructures 24, which serve respectively as a straight waveguide device and a microring waveguide device of a microring resonator, formed in accordance with the method of the present invention.

Figure 5:
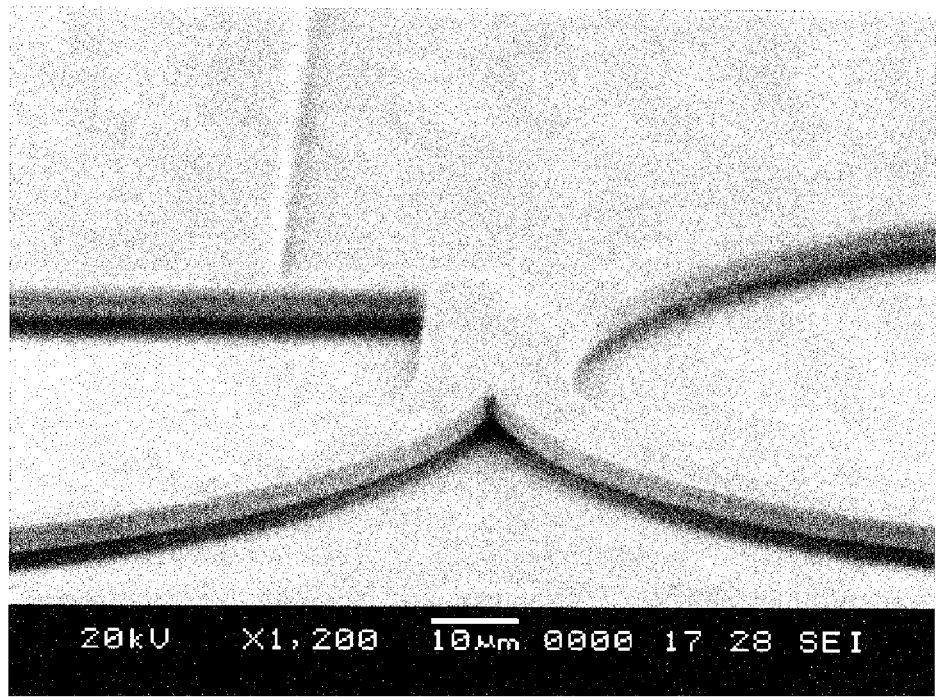
FIG. 5 is a SEM image to show the structure of another undercut microstructure, which serves as an output (i.e., drop port) waveguide device of the microring resonator on the $LiNbO_3$ substrate, made by the method of this invention.

FIG. 5 shows the SEM image of another undercut microstructure 24, which serves as an output (drop port) waveguide device of the microring resonator, formed in accordance with the method of the present invention.

FIGS. 4 and 5 show that the method of this invention is capable of forming the undercut microstructure 24 such that the trunk portion 241 thereof is tapered toward the upper end 241a and has a small width ($W_3$) along the direction (X), thereby permitting an increase in the refractive index contrast at the bottom side of the enlarged top end portion 242, which, in turn, reduces the loss of the optical field propagating into the substrate 2 and increases confinement of the optical field in the enlarged top end portion 242, and thereby permitting reduction of the radius of the microring waveguide and achievement of a highly dense optical integrated circuit integrated with the microstructures made by the method of the present invention.

In conclusion, by ion implanting the substrate 2 according to the method of this invention, a predetermined pattern of the damaged region 22 in the substrate 2 can be formed, which permits formation of a predetermined structure of the undercut microstructure 24. Furthermore, before ion implantation and etching, the etch mask 31 and the ion implantation mask 32 have been simultaneously formed on the substrate 2, so that the method of this invention is relatively simple as compared to the prior art.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A method of forming an undercut microstructure having a trunk portion and an enlarged top end portion that is connected to the trunk portion, the method comprising:

forming an etch mask on a top surface of a substrate;

forming, on a top surface of the etch mask, an ion implantation mask having a top surface that is smaller than the top surface of the etch mask and that does not extend beyond the top surface of the etch mask;

ion implanting the substrate in the presence of the etch mask and the ion implantation mask so that a damaged region is generated at a depth below an area of the surface that is not masked by the ion implantation mask; and etching the surface of the substrate until the damaged region is removed.

2. The method of claim 1, wherein the etch mask is made from one of photoresists, dielectrics, and metals, the ion implantation mask being made from one of photoresists, dielectrics, and metals.

3. The method of claim 1, wherein the etching of the substrate is conducted by one of wet etching techniques, reactive ion etching techniques, plasma etching techniques, and inductively coupled plasma etching techniques.

4. The method of claim 1, further comprising removing the ion implantation mask after ion implantation and prior to the etching of the substrate.

5. The method of claim 1, further comprising removing the etch mask after the etching of the ion implanted substrate.

6. The method of claim 1, wherein formation of each of the etch mask and the ion implantation mask is performed by coating, followed by lithography, the lithography being conducted through one of photolithography techniques and electron-beam lithography techniques.

* * * * *